United States Patent

Montgomery, deceased

[15] 3,678,183

[45] July 18, 1972

[54] AUTOMATIC FREQUENCY CONTROL OF VOLTAGE VARIABLE REACTANCE TUNED RECEIVERS

[72] Inventor: Andrew P. Montgomery, deceased, late of Glenside, Pa. by Ann P. Montgomery, executrix

[73] Assignee: Philco-Ford Corporation, Philadelphia, Pa.

[22] Filed: April 26, 1971

[21] Appl. No.: 137,484

[52] U.S. Cl. ....................... 178/5.8 AF, 178/7.3 R, 325/422, 334/16, 334/15

[51] Int. Cl. ....................... H04b 1/16, H03j 5/00

[58] Field of Search ....................... 178/5.8 R, 5.8 AF, 7.3 R; 325/452, 453, 457, 464, 465, 416–422; 334/14–16

[56] References Cited

UNITED STATES PATENTS

| | | | |
|---|---|---|---|
| 2,896,018 | 7/1959 | Rhodes et al. | 178/5.8 AF |
| 3,619,492 | 11/1971 | Evans | 325/422 |

FOREIGN PATENTS OR APPLICATIONS

| | | | |
|---|---|---|---|
| 1,815,437 | 6/1970 | Germany | 178/5.8 AF |

*Primary Examiner*—Robert L. Richardson
*Attorney*—Robert D. Sanborn

[57] ABSTRACT

A jogging circuit is incorporated into the automatic frequency control system associated with touch-button tuning of television receivers that contain voltage variable reactance tuning elements. Each time a touch button is operated, the voltage applied to the tuning system is made to change first to a predetermined value and then return to its preset value. Thus the receiver tuning will be varied, each time a new channel is selected, so that the preset tuning is always approached from the same direction. This avoids the possibility of spurious automatic frequency control locking to the wrong signal carrier. In a television receiver, the television picture carrier is the desired reference. If the local oscillator is operated above the picture carrier, the local oscillator signal is jogged to a lower than normal frequency each time a touch-button is operated, and the preset tuning point is always approached from the low frequency side. Since the sound carrier is at the high frequency end of the television channel, spurious sound carrier locking is avoided.

5 Claims, 2 Drawing Figures

INVENTOR.
ANDREW P. MONTGOMERY, DECEASED,
BY ANN P. MONTGOMERY, EXECUTRIX
BY Gail W. Woodward
AGENT INVENTOR.
ANDREW P. MONTGOMERY,
DECEASED,
BY ANN P. MONTGOMERY,
EXECUTRIX,
BY Gail W. Woodward
AGENT

AUTOMATIC FREQUENCY CONTROL OF VOLTAGE VARIABLE REACTANCE TUNED RECEIVERS

BACKGROUND OF THE INVENTION

Voltage variable reactance tuning elements have been incorporated into television tuners and have substantially improved such tuners, particularly those covering the UHF portion of the spectrum. The tuners have been made more compact, less subject to mechanical shock and vibration, and the mechanical tuning function can be performed remotely with a potentiometer and regulated voltage source. Presently the voltage variable capacitor (VVC) in the form of a semiconductor diode is the preferred tuning element but other forms can be employed. In addition a bank of touch-buttons can be associated with a bank of potentiometers by means of latching circuits so that fully electronic touch-button control can be achieved.

Automatic frequency control (AFC) can be applied to the VVC tuned circuit by way of the voltage regulator that stabilizes the d-c voltage applied to the tuning potentiometer. The regulator is required to avoid tuning changes that otherwise would occur when the a-c line voltage changes or when receiver circuit conditions change power supply loading.

In a television receiver AFC action is controlled by a video carrier discriminator that is tuned to the video intermediate frequency (i.f.). The discriminator output is connected to the voltage regulator control circuit. The discriminator, when not receiving the proper frequency carrier, produces an output that will vary the regulator output and hence the receiver local oscillator to produce the correct i.f.

When AFC is used in a television receiver that also employs touch-button selection of preset channels, each touch-button represents a voltage level selected by a preset potentiometer. When switching from a higher to a lower channel, in which event the tuning voltage approaches its final value going from high to low, the first carrier encountered in the desired channel will be the sound carrier. AFC action will tend to lock the tuning to this carrier which, in a system employing a video carrier discriminator, amounts to a spurious carrier. When the selection action takes the receiver from a lower to a higher channel the problem does not exist because the first signal encountered in the desired channel is the correct one, i.e., the picture carrier.

SUMMARY OF THE INVENTION

It is an object of this invention to avoid spurious AFC locking in a touch-button controlled VVC tuned receiver with AFC.

It is a further object to avoid spurious AFC locking by means of a jogging circuit that causes the final tuning voltage to be approached always from the same direction.

These and other objects are achieved by a jogging circuit actuated by touch-button operation to produce a pulse waveform that smoothly and quickly returns to the desired preset value. This waveform is applied to the regulator control circuit so that the regulated voltage follows the same pattern. Thus when a preset voltage is actuated by a touch-button, the transient causes the actual voltage to be other than the preset value and the final value is then always approached from the same side. In a typical television receiver using VVC tuning elements, the local oscillator is ordinarily operated on the high frequency side of the carrier and the video carrier is preferred for locking. In this case the jogging circuit causes the regulated voltage to drop momentarily thereby lowering the local oscillator tuning so that it approaches the set point from the low frequency side.

DESCRIPTION OF THE PREFERRED PRACTICE OF THE INVENTION

Figure 1:
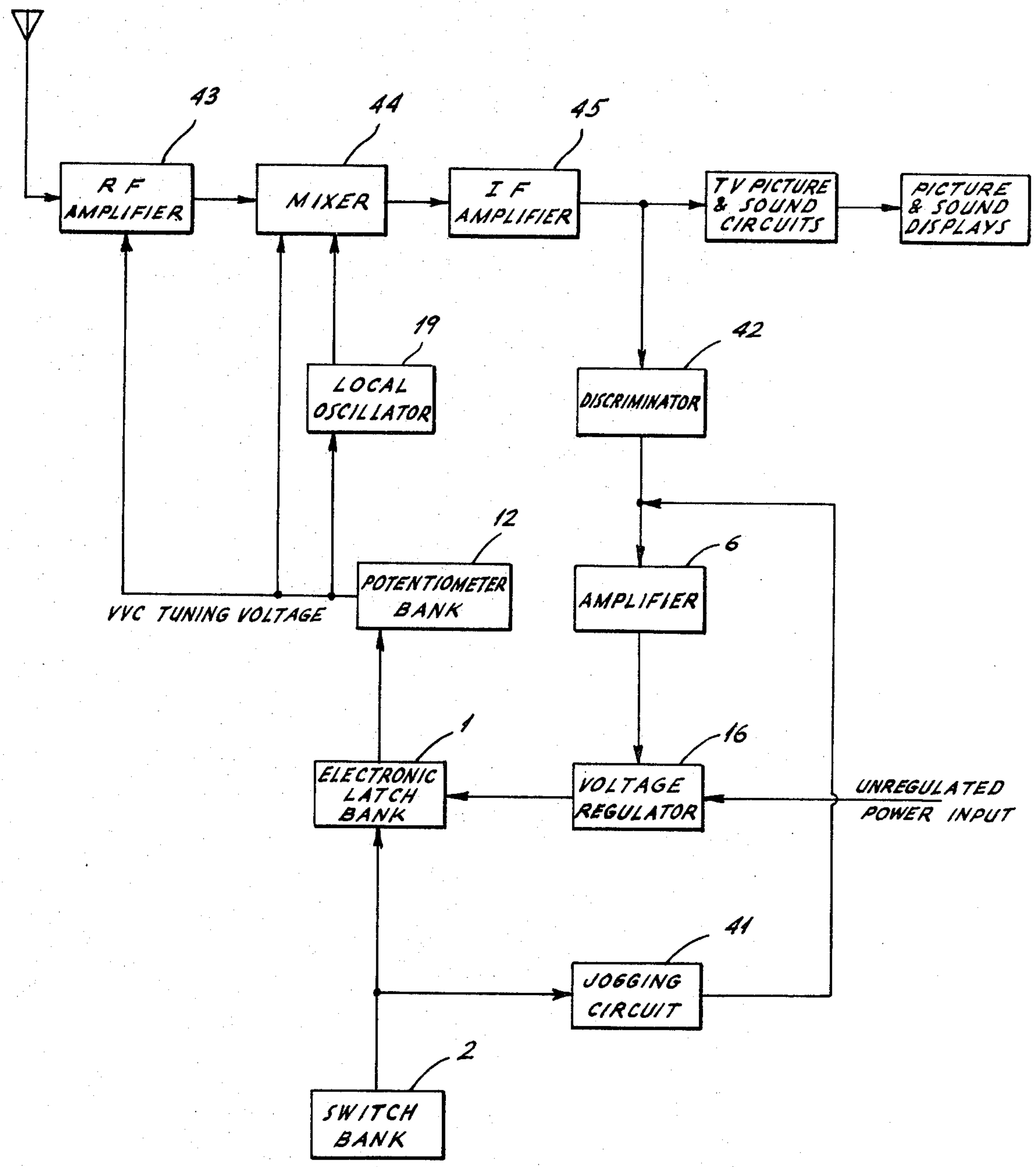
FIG. 1 is a block diagram of a television receiver employing the invention.

In FIG. 1 the television receiver is shown in block diagram form. A bank of touch-button, momentary-contact, spring-return switches 2 operate a corresponding bank of electronic latches 1 that are used to connect a source of regulated d-c voltage 16 to a bank of potentiometers 12. In operation one touch-button will actuate one latch to the exclusion of all others so that the related potentiometer will act as a variable source of d-c potential to be used in tuning the receiver r-f amplifier 43, mixer 44, and local oscillator 19.

AFC operation is achieved by means of a discriminator 42, which receives an i-f signal from i-f amplifier 45. The discriminator output is connected to amplifier 6 which feeds a signal to the control section of voltage regulator 46. Since the regulated voltage is the source of receiver local oscillator tuning its output will control the i.f. If the discriminator is poled so that its action via the amplifier and regulator will tend to maintain the desired i.f., AFC action is present.

In the television receiver the tuner usually comprises an r-f amplifier 43, mixer 44, and local oscillator 19. These three circuits are tuned by a set of semiconductor diodes that are matched so that a single voltage will cause the three tuned circuits to track in terms of frequency versus voltage. Thus a single voltage source will tune the entire receiver. Since only the local oscillator is the element that actually tunes the receiver i-f signal, the effect of AFC will be associated with the local oscillator tuned circuit 19 shown in broken lines in FIG. 2. The receiver system as thus far described is more fully described, and claimed, in a copending application of Rufus F. Shelby, Ser. No. 135,596, filed Apr. 20, 1971.

Jogging circuit 41 is actuated each time a touch button in switch bank 2 is actuated, and its output is added to the discriminator output. The jogging circuit, which will be explained in detail hereinafter, shifts or "jogs" the output of the voltage regulator momentarily and then allows it to return to its preset value. This action shifts the receiver tuning so that the final or preset tuning is always approached from the same direction regardless of whether a higher or lower frequency station is being selected.

The remainder of the television circuits are conventional and need not be detailed here to understand the invention.

Figure 2:
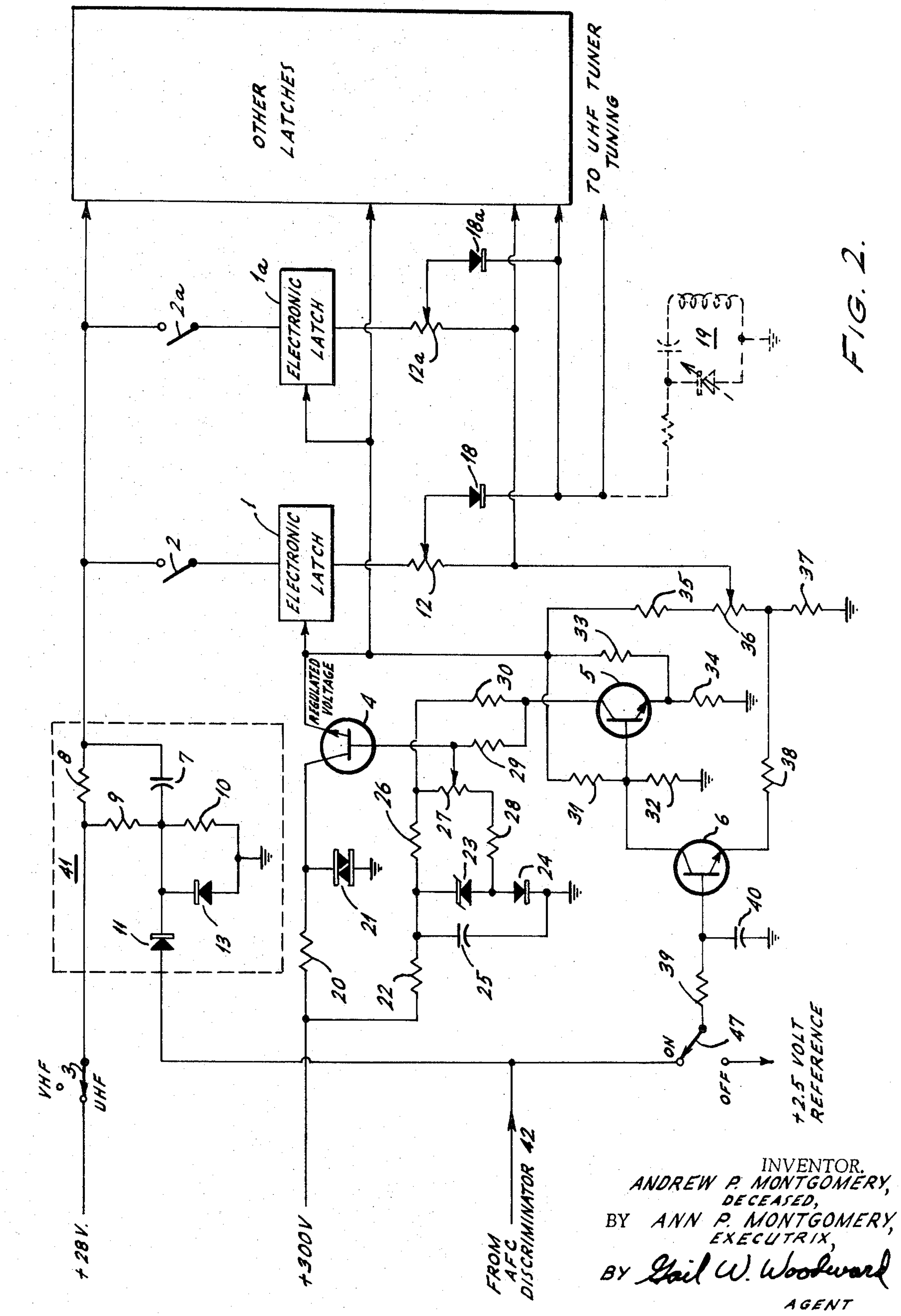
FIG. 2 is a combined schematic block diagram detailing the preferred circuit of the invention.

In FIG. 2 an unregulated d-c potential of 28 volts is applied to the system. In the UHF television tuner example given, this voltage is applied through the UHF-VHF switch 3. A regulated d-c potential of about 27 volts is produced from the receiver's 300-volt line by means of a voltage regulator circuit (to be described directly) for application to the receiver's electronic latches 1, 1*a*, etc. Series regulator transistor 4 has its collector supplied with a relatively constant 40-volt level by the action of series resistor 20 and shunt varistor 21 from the receiver's 300-volt power supply. Resistor 22 and zener diode 23 provide a reference voltage at their juncture of 33 volts. Forward biased silicon diode 24 temperature compensates the regulator, and capacitor 25 bypasses zener diode noise. Potentiometer 27 in conjunction with resistors 26 and 28 provide an adjustable reference and hence output for series regulator transistor 4. Control transistor 5 has its collector coupled to the base of transistor 4 by resistor 29, and by resistor 30 and potentiometer 27. The operating point of control transistor 5 is set by two voltage dividers connected to the regulated voltage at the emitter of transistor 4. The emitter divider resistors 33 and 34 produce a greater divider action than base divider resistors 31 and 32. Therefore the base of transistor 5 will more actively respond to any change in regulated voltage. If the regulated voltage tends to rise, the base of transistor 5 rises more than does its emitter, and hence the collector potential is caused to decrease. This decreases the base and hence emitter potential of transistor 4. This is the basic voltage regulator action that stabilizes the voltage level at the particular value established by circuit component values and by potentiometer 27.

When a touch-button 2 is actuated the associated electronic latch 1 connects the regulated voltage to the associated tuning potentiometer 12 which then becomes the receiver tuning control and can be preset to a particular channel. The associated diodes 18 act to isolate those potentiometers that are not associated with an "on" latch. In addition a circuit, not shown, common to all latches acts to turn "off" all latches not associated with the touch-button being actuated. Thus only one latch at a time will be "on". This latter feature is also shown in the above-identified copending application.

AFC action occurs through the operation of discriminator 42. When the AFC switch 47 is in the "on" position the discriminator output is connected to amplifier transistor 6 through a transient filter comprising series resistor 39 and shunt capacitor 40. The nominal discriminator output when receiving a signal of the desired frequency is 2.5 volts. When a low frequency signal is received the discriminator output goes more positive thereby increasing conduction in transistor 6. This lowers its collector voltage and hence the base voltage of transistor 5. This action raises the collector voltage of transistor 5 which raises the base and emitter voltage of transistor 4. The increase of regulated voltage raises the frequency of local oscillator 19 thereby restoring the i.f. toward the desired value. Thus AFC action is achieved by modulating the regulated voltage by means of the discriminator.

Constant AFC action regardless of the setting of tuning potentiometer 12 is achieved by feeding a portion of the amplified discriminator signal to the end of potentiometer 12 not connected to the regulated voltage. Resistors 35 and 37 in conjunction with potentiometer 36 form a voltage divider. Potentiometer 36 provides an adjustable voltage for the lower end of the tuning potentiometer 12. AFC action is applied to the voltage divider by way of resistor 38 so that any change in discriminator voltage causes both ends of potentiometer 12 to change in the same direction. The curve of compensation versus setting of potentiometer 12 is set by the divider action of resistors 37 and 38.

Potentiometers 27 and 36 are service adjustments that permit tracking potentiometer 12 with an associated dial indicator. Potentiometer 27 tracks the high frequency channels and potentiometer 36 tracks the low frequency channels.

In the jogging circuit 41, capacitor 7 connects between the 28-volt line, through resistor 8, and a source of about 6.5 volts produced by the divider action of resistors 9 and 10. Thus capacitor 7 is charged to about 21.5 volts. Diode 11 connects capacitor 7 to the discriminator output and hence the voltage regulator when the AFC switch 47 is tuned "on". Since the discriminator nominal output is about 2.5 volts, diode 11 will ordinarily be back biased by about 4 volts and therefore nonconductive. Under these conditions, circuit and AFC operations are normal.

When any touch-button, for example touch-button 2, is pressed a substantial voltage drop (about 15 volts) appears across resistor 8 and the related latch 1 is turned "on". Capacitor 7 will start to discharge and quickly drive the voltage at the juncture of resistors 9 and 10 to a negative potential. Forward conduction of diode 13 sets the negative voltage to about 0.7 volt. Diode 11 is now also forward biased thereby driving the AFC output to ground potential or about 2.5 volts below its nominal value. Capacitor 7 will continue to discharge until the junction of resistors 9 and 10 returns to 6.5 volts at which time diodes 11 and 13 will again be back biased and the AFC output returned to normal. During this negative impulse interval, the regulated output voltage will also make a negative excursion thereby reducing the tuning potentiometer voltage. As capacitor 7 discharges the regulated voltage returns to its nominal value and the tuning to its preset value. Thus the negative excursion of voltage will cause the receiver local oscillator to be jogged or initially tuned too low when a touch button is pressed. The the tuning will approach its preset value from the low frequency condition and avoid spurious sound i-f AFC locking.

Successful operation of the circuit of this invention has been obtained when using the critical parts of the following list:

| | | |
|---|---|---|
| Transistor 4 | — | NPN Silicon 2N2863 |
| Transistor 5 | 13 | NPN Silicon 2N3904 |
| Transistor 6 | — | NPN Silicon 2N3904 |
| Capacitor 7 | — | 10mfd |
| Resistor 8 | — | 270 ohms |
| Resistor 9 | — | 33K ohms |
| Resistor 10 | — | 10K ohms |
| Diode 11 | — | Silicon Planar FD-100 |
| Resistor 12 | — | 50K ohms linear |
| Diode 13 | — | Silicon Planar FD-100 |
| Resistor 20 | — | 15K ohms 7 watt |
| Diode 21 | — | 40-volt varistor |
| Resistor 22 | — | 36K ohms 3 watt |
| Diode 23 | — | 33 volt zener ZTK-33 |
| Diode 24 | — | Silicon planar FD-100 |
| Capacitor 25 | — | 0.1 mfd |
| Resistor 26 | — | 470 ohms |
| Resistor 27 | — | 10K ohms linear |
| Resistor 28 | — | 22K ohms 5% |
| Resistor 29 | — | 100K ohms |
| Resistor 30 | — | 2.2K ohms |
| Resistor 31 | — | 6.2K ohms 5% |
| Resistor 32 | — | 5.1K ohms 5% |
| Resistor 33 | — | 27K ohms 5% |
| Resistor 34 | — | 6.8K ohms 5% |
| Resistor 35 | — | 5.6K ohms 5% |
| Resistor 36 | — | 2K ohms |
| Resistor 37 | — | 82 ohms |
| Resistor 38 | — | 2.7K ohms |
| Resistor 39 | — | 1K ohms |
| Capacitor 40 | — | .01 mfd |

Note: All resistors ¼ watt 20% resistance tolerance unless otherwise indicated.

I claim:

1. In a superheterodyne television signal receiver having voltage variable reactance tuning elements varied by means of touch-button selected potentiometers energized from a regulated voltage power supply by means of electronic latching circuits and having automatic frequency control operating from a discriminator tuned to one of the receiver intermediate frequencies, said discriminator output signal controlling the output of said power supply, the improvement comprising: a circuit actuated by said touch-button for shifting the output voltage of said regulator in a give direction and then returning the voltage to its nominal value.

2. The improvement of claim 1 wherein said regulator is shifted so as to decrease its output when said circuit is actuated.

3. In a touch-button actuated electronic latching system for tuning a television receiver employing voltage variable capacitor tuning, an improved automatic frequency control circuit comprising:

a. a regulated power supply;

b. a plurality of touch-buttons for actuating preset tuning for selected television channels;

c. a plurality of electronic latches, one for each touch-button, each electronic latch comprising: a potentiometer, and a switching circuit for connecting said potentiometer to said regulated power supply in response to actuating one of said touch buttons;

d. a discriminator tuned to an intermediate carrier frequency;

e. means for controlling said regulated voltage in accordance with said discriminator output to achieve automatic frequency control of said receiver; and f. means responsive to the actuation of any one of said plurality of touch-buttons for introducing a brief voltage transient of predetermined polarity in the output of said discriminator whereby the receiver tuning frequency is momentarily changed to avoid spurious automatic frequency control locking.

4. The improved automatic frequency control circuit of claim 3 wherein said discriminator is tuned to the video intermediate frequency carrier and said means responsive to the actuation of any one of said plurality of touch-buttons momentarily lowers the receiver tuning frequency.

5. In a television receiver of the superheterodyne type adapted to receive video and accompanying sound transmissions in any selected one of a plurality of channels, voltage variable capacitor tuning means for tuning at least the local oscillator of said receiver, manually operated station selection means for selecting any one of said channels, means responsive to said manually operated station selection means for applying to said voltage variable capacitor tuning means a predetermined voltage representative of the channel selected, automatic frequency control means tuned to the video carrier for adjusting said predetermined voltage to effect automatic fine tuning control, and means responsive to each actuation of said station selection means for adding to said predetermined voltage a brief voltage transient of predetermined polarity, whereby tuning of each selected channel is approached from the video rather than the sound carrier side of said channel.

* * * * *